United States Patent [19]

Sasaki et al.

[11] Patent Number: 4,874,957
[45] Date of Patent: Oct. 17, 1989

[54] CONTACT TYPE IMAGE SENSOR

[75] Inventors: Saburo Sasaki, Sendai; Tsutomu Ishida, Machida; Kenji Yamamoto, Miyagi, all of Japan

[73] Assignees: Ricoh Company, Ltd., Tokyo; Ricoh Research Institute of General Electronics, Natori, both of Japan

[21] Appl. No.: 249,673

[22] Filed: Sep. 27, 1988

[30] Foreign Application Priority Data

Oct. 2, 1987 [JP] Japan .................. 62-250426

[51] Int. Cl.$^4$ .............................. H01J 40/14
[52] U.S. Cl. .................. 250/578; 250/211 R; 357/30
[58] Field of Search ............. 250/578, 211 R, 211 J; 357/30 H, 30 D, 30 Q, 30 R; 358/213.11, 213.13, 212

[56] References Cited

U.S. PATENT DOCUMENTS 4,672,221 6/1987 Saito et al. .................. 250/578
4,719,345 1/1988 Arita ........................ 250/578

Primary Examiner—Edward P. Westin
Assistant Examiner—Khaled Shami
Attorney, Agent, or Firm—Oblon, Spivak, McClelland, Maier & Neustadt

[57] ABSTRACT

A contact type image sensor includes a plurality of opaque metallic films formed on top of a transparent insulating substrate. Each opaque metallic film is located between adjacent lower electrodes formed on a transparent insulating film so as to prevent light emitted from a light source from being irradiated on a document to be scanned. Further, each opaque metallic film is located between adjacent upper extension electrodes connected to transparent conductive films formed on photoelectric conversion layers, so as to prevent the light from being irradiated on the document. Only light which is emitted from the light source and then passes through the light window, is irradiated on the document.

12 Claims, 6 Drawing Sheets

CONTACT TYPE IMAGE SENSOR

BACKGROUND OF THE INVENTION

The present invention generally relates to a contact type image sensor, and in particularly to a contact type image sensor which can be suitably applied to a facsimile machine, a digital copying machine, an optical character reader, an electronic blackboard apparatus and the like.

A conventional optical reader which has an image sensor and may be used for a facsimile machine, is shown in FIG. 1. Referring to FIG. 1, the illustrated optical reader includes an image sensor 1 of a metal oxide semiconductor (MOS) type or a charge-coupled device (CCD) type, which is produced by integrated circuit techniques. A document 2 is irradiated by a fluorescence lamp 3. Light emitted from the fluorescence lamp 3 is reflected on the document 2. Reflected light passes through a reduction optical lens 4, and forms an image on the image sensor 1. The image formed on the image sensor 1 is a reduced image. The reduced image is subjected to photoelectric conversion in the image sensor 1. Then, the image sensor 1 generates an electric signal corresponding to the reduced image.

The above optical reader utilizes the reduction optical lens 4. For this reason, in a case where a reduction factor of the optical lens 4 is increased, an optical length between the document 2 and the image sensor 1 is increased. This prevents the miniaturization of the optical reader. Additionally, the resolving power or resolution of a peripheral portion of the reduced image formed on the image sensor 1 is degraded due to optical characteristics of the optical lens 4. Further, the signal-to-noise ratio (S/N ratio) of the peripheral image portion is reduced, because of a smaller amount of light which passes through a peripheral portion of the optical lens 4.

In order to overcome the above disadvantages, an optical reader as shown in FIG. 2 has been proposed. A contact type image sensor 5 has a size identical to a width of the document 2. The document 2 is irradiated by light which is emitted from the fluorescence lamp 3 or an LED array and which passes through the image sensor 5. The light is reflected on the document 2, and the reflected light is received by the image sensor 5.

FIG. 3 shows an elevational cross section of the image sensor 5 shown in FIG. 2. FIG. 4 is a enlarged front view of the image sensor 5. An opaque metallic film 7, in which a light window 17a is formed, is formed on top of a transparent insulating substrate 6. A transparent insulating film 8 is formed on the opaque metallic film 7 and an exposed surface portion of the transparent insulating substrate 6. Lower electrodes 9 each having a light window 17b are formed on the transparent insulating film 8. A photoelectric conversion layer 10 is formed on each of the lower electrodes 9. A transparent conductive film 11 is formed on each of the photoelectric conversion elements 10. An interlayer insulating film 12 is formed as shown in FIG. 3, and through holes 28 are formed therein so that portions of the surface of the transparent conductive film 11 are exposed. Upper extension electrodes 13 which extend in a predetermined direction, are formed as shown in FIGS. 3 and 4. The upper extension electrodes 13 are kept in electric contact with the corresponding transparent conductive films 11. Finally a passivation film 14 is formed on the entire surface, and then a transparent wear-resistant plate 16 is fixed on the passivation film 14 by an adhesive layer 15.

The light emitted from the fluorescence lamp 3 passes through the light windows 17a an 17b, and is then reflected o the document 2 which is made to slide on the transparent wear-resistant plate 16. The reflected light passes through the transparent conductive film 11, and then enters the photoelectric conversion layers 10. An electric signal which corresponds to the received light, can be read out across the lower electrode 9 and the upper extension electrode 13. The above structure makes i possible to considerably reduce the optical distance between the document 2 and the image sensor 5, compared with the structure of FIG. 1 using the reduction optical lens 4. Therefore, a smaller size of the optical reader is obtainable. Additionally the image sensor 5 has the size which corresponds to that of the document 1. Therefore, the resolution of a peripheral portion of the document 2 can be prevented from being decreased.

The fluorescence lamp 3 must be located on the side of a rear (bottom) face of the image sensor 2, because the document 2 is placed so as to make contact with a front (top) face of the image sensor 5. Therefore, it is required for providing the opaque metallic film 7 in order to prevent the light emitted from the fluorescence lamp 3 from directly entering the photoelectric conversion elements 10. However, it should be noted that a stray or parasitic capacitance is formed by the opaque metallic film 7 and the lower electrodes 9, between which the transparent insulating film 8 which is interposed. The stray capacitance becomes great in the case of a longitudinal image sensor. The stray capacitance is a main factor in reducing an output signal of the image sensor, increasing noise and crosstalk. Thus, sensor characteristics are degraded due to the stray capacitance. Additionally, since an opposing area of the opaque metallic film 7 and the corresponding lower electrode 9 is great, the ratio of occurrence of short-circuit due to a pin hole which may be formed in the transparent insulating film 8 is high, and correspondingly the yield rate of production of image sensors is low.

SUMMARY OF THE INVENTION

Accordingly a general object of the present invention is to provide a contact type image sensor in which the above disadvantages are eliminated.

A more specific object of the present invention is to provide a contact type image sensor which enables an increased output signal, decreased noise and crosstalk. Thereby, resolution of an image formed from the sensor output signal can be improved.

The above objects of the present invention are achieved by a contact type image sensor which includes the following elements. A plurality of opaque metallic films are formed on top of a transparent insulating substrate. A transparent insulating film is formed so as to cover the plurality of opaque metallic films. A plurality of lower electrodes are formed on top of the transparent insulating film, each having a light window. Each opaque metallic film is located between adjacent lower electrodes so as to prevent light emitted from a light source from being irradiated on a document to be scanned. A plurality of photoelectric conversion layers are formed on the lower electrodes. A plurality of transparent conductive films are formed on top of the corresponding photoelectric conversion layers. A transparent interlayer insulating film is formed so as to cover the plurality of photoelectric conversion layers. The transparent interlayer insulating film has through holes for establishing connections with the transparent conductive films. A plurality of upper extension electrodes are connected to the corresponding transparent conductive films through the through holes. Each opaque metallic film is located between adjacent upper extension electrodes so as to prevent the light from being irradiated on the document. Only light which is emitted from the light source and then passes through the light window, can be irradiated on the document.

Other objects, features and advantages of the present invention will become apparent from the following detailed description when read in conjunction with the accompanying drawings.

DETAINED DESCRIPTION

Figure 5:
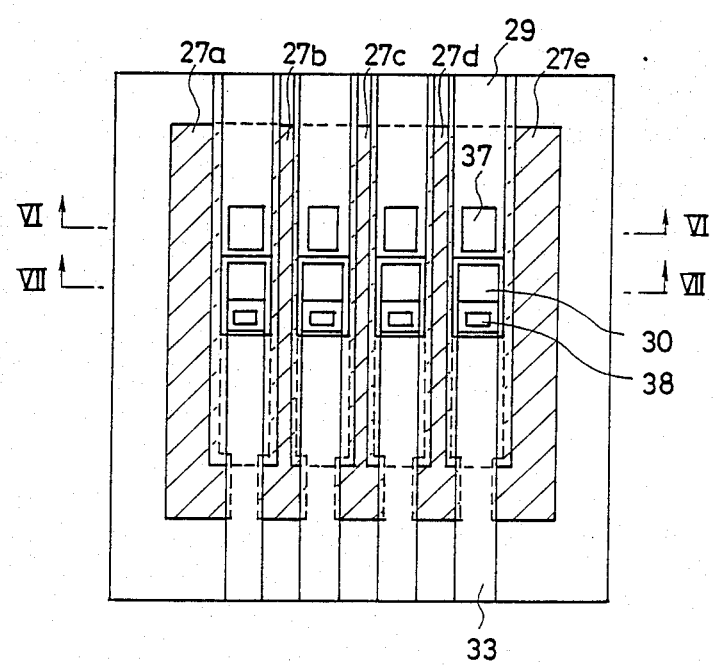
FIG. 5 is an enlarged plan view of a preferred embodiment of the present invention.
Figure 6:
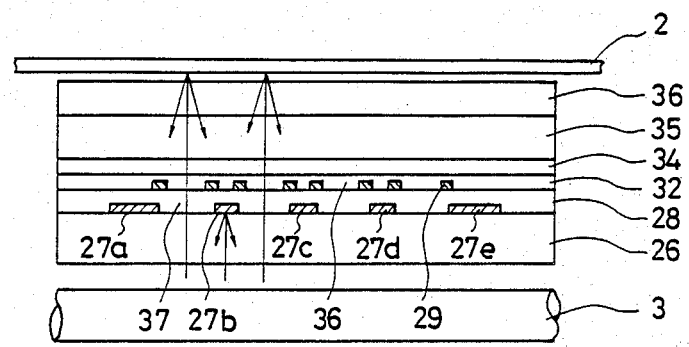
FIG. 6 is an elevational cross sectional view taken along a line VI—VI of FIG. 5.
Figure 7:
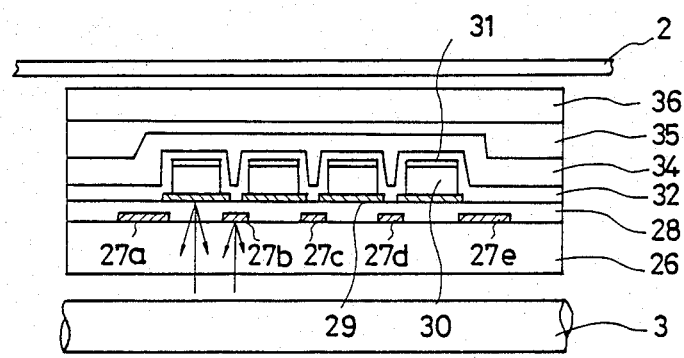
FIG. 7 is an elevational cross sectional view taken along a line VII—VII of FIG. 5.

A description is given of a preferred embodiment of the present invention with respect to FIGS. 5 through 7.

Referring to FIGS. 5 through 7, a transparent insulating substrate 26 is formed by using PYREX (manufactured by Corning Glass), or heat-resistant glass such as fused quartz. An opaque metallic film having a thickness of around 1000–1500 Å is coated on the transparent insulating film 26 by vapor evaporation, sputtering or the like. The opaque metallic film 27 may be made of chromium (Cr), nickel chromium (NiCr), tungsten (W), molybdenum (Mo) and so on. Then, the opaque metallic film is patterned by the photolithography technique so as to form a plurality of opaque metallic films 27a–27e. In the photolithography technique, a patterned mask film is formed on the opaque metallic film 27, and then the film 27 is patterned by etching. The opaque metallic films 27a–27e are approximately 5–10 μm wider than a width of patterns of lower electrodes 29 and upper extension electrodes 33, which are almost identical in width to each other. Next a transparent insulating film 28 having a thickness of about 2–3 μm is formed, by sputtering, plasma chemical vapor deposition (PCVD), or the like, on the transparent insulating substrate 26, on which the opaque metallic films 27a–27e are formed. The transparent insulating film 28 may be made of silicon dioxide ($SiO_2$), silicon oxide nitride ($SiO_xN_y$), silicon nitride ($Si_3N_4$), and so on. Subsequently, a metallic film having a thickness of around 1000–1500 Å is formed on the transparent insulating film 28 by vapor evaporation or sputtering, and is patterned by using the photolithography technique. Thereby, lower electrodes 29 which are mutually separated, are formed. The patterning process is controlled so that each of the opposing (overlapping) portions of the opaque metallic films 27a–27e and the lower electrodes 29, between which the transparent insulating film 28 is interposed, has an area of approximately 5–10 μm. Subsequently, a multilayer film made of amorphous silicon (a-Si) is coated on the entire surface by PCVD or the like so as to have a thickness of 5000 Å–2 μm. Further, indium-tin-oxide (hereinafter simply referred to as ITO ) or $S_mO_2$ is coated on the photoelectric conversion layer by sputtering or vapor evaporation so that a transparent conductive film of a thickness of about 750–1500 Å is formed thereon. Thereafter, by using the photolithography technique, the transparent conductive film and the photoelectric conversion layer are patterned so that a plurality of separated portions each consisting of a transparent conductive film 31 and a photoelectric conversion layer 30, are formed. It is preferable to form the conductive films 31 so as to be 5 μm smaller in width than the corresponding photoelectric conversion layers 30.

Then, a transparent interlayer insulating film 32, which is used for protecting end faces of the photoelectric conversion layers 30, are formed on the entire surface of the substrate 26 by sputtering, PCVD or the like. The transparent interlayer insulating film 32 may be made of $SiO_2$, $SiO_xN_y$, $Si_3N_4$ or the like. The transparent interlayer insulating film 32 is 3000–5000 Å in thickness. Subsequently, through holes 38 for establishing connections with the transparent conductive films 31, are formed in the transparent interlayer insulating film 32 by the photolithography technique. Subsequently, a multilayer film which may be a chromium-aluminum (Cr—Al) film, a chromium-aluminum-silicon-copper (Cr—Al—Si—Cu) film or the like, is formed on the transparent interlayer insulating film 32. Then the multilayer film is patterned by the photolithography so that upper extension electrodes 33 are formed. The upper extension electrodes 33 make electric contact with the corresponding transparent conductive films 31 through the through holes 38. The photolithography process is carried out so that an opposing (overlapping) area of each of the opaque metallic films 27a–27e and the corresponding upper extension electrode 31, between which the transparent interlayer insulating film 32 is interposed, is about 5–10 μm in thickness. Subsequently, a passivation film 34, which is about 1–2 μm in thickness, is coated on the entire surface of the substrate 26 by sputtering, PCVD or the like. The passivation film 34 may be made of $SiO_2$, $SiO_xN_y$, $Si_3N_4$ or the like. Finally, a transparent wear-resistant plate 36 having a thickness of approximately 20–100 μm is fixed on the passivation film 34 by an adhesive layer 35. The transparent wear-resistant plate 36 may be formed from a glass plate, on which a hard film of a thickness of 1–2 μm, made of $Si_3N_4$, boron nitride (BN) or the like, is coated by PCVD or the like. The adhesive layer 15 may be made of transparent epoxy resin or transparent acrylic resin.

As shown in FIG. 6, light emitted from the fluorescence lamp 3 is irradiated on the document 2 through the light windows 37, and reflected light reaches the transparent conductive films 31. The light emitted from the fluorescence lamp 3 is not irradiated on the lower electrodes 29 due to the presence of the opaque metallic films 27a-27e.

As shown in FIG. 7, the light emitted from the fluorescence lamp 3 is shut out by the opaque metallic films 27a-27e and the lower electrodes 29. Further, the light emitted from the fluorescence lamp 3 is shut out by the upper extension electrodes 33. As a result, only light which passes through the light windows 37 can be irradiated on the document 2.

Figure 8:
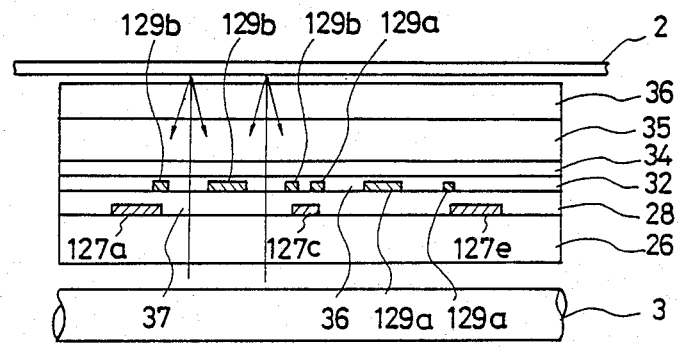
FIGS. 8 and 9 are elevational cross sectional views of another preferred embodiment of the present invention.
Figure 9:
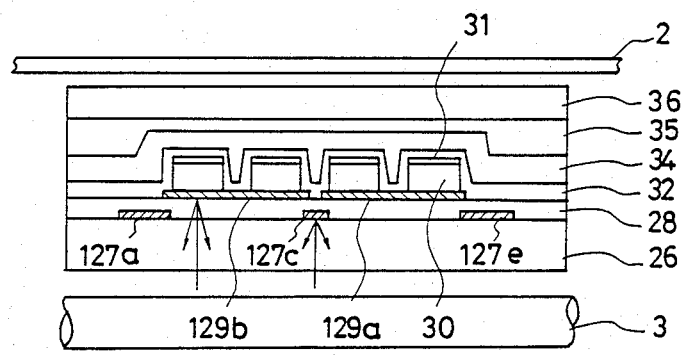

Another (second) embodiment is shown in FIGS. 8 and 9. FIG.8 shows an elevational cross section of the second embodiment which corresponds to a cross section taken along the line VI—VI of FIG. 5. FIG. 9 shows an elevational cross of the second embodiment which corresponds to a cross section taken taken along the line VII—VII of FIG. 5. In the embodiment shown in FIGS. 5 through 7, one lower electrode 29 is provided for each of the photoelectric conversion layers 30. On the other hand, in the second embodiment, one lower electrode is provided in common for a plurality of photoelectric conversion layers 30. Referring to FIGS. 8 and 9, a lower electrode 129a is provided in common for two right-hand photoelectric conversion elements 30, and another lower electrode 129b is provided in common for two left-hand photoelectric conversion elements 30. An opaque metallic film 127c, which is formed on the transparent insulating substrate 26, is provided between the adjacent lower electrodes 129a and 129b. Opaque metallic films 127a and 127e are provided as in the case of the first embodiment. In the embodiment of FIGS. 8 and 9, one lower electrode is provided for every two bits. Instead, one lower electrode may be provided for every 64 bits, for example. In this case, the number of opaque metallic films such as electrodes 127a, 127c and 127e, is selected, depending on photoelectric conversion characteristics and readout characteristics of a circuit for reading out signals derived from the image sensor.

In the above embodiments, capacitance is formed between the lower electrodes 29 and the upper electrodes 33 between which the transparent interlayer insulating film 28, is formed. This capacitance can improve photoelectric conversion characteristics of the image sensor. The capacitance is set equal to an optimum value, depending on an opposing area of each lower electrode 29 and the corresponding upper electrode 33, the thickness and dielectric constant of the transparent interlayer insulating film 32.

Figure 10:
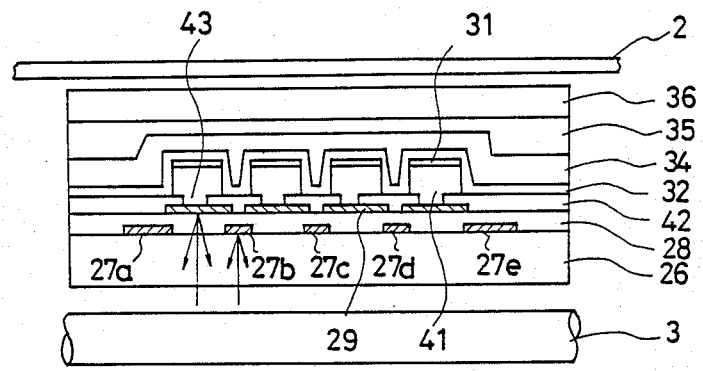
FIG. 10 is an elevational cross sectional view of yet another preferred embodiment of the presen invention.

In the above embodiments, the photoelectric conversion layers 30 are formed directly on the corresponding lower electrodes 29. Alternatively, as shown in FIG. 10, a transparent insulating film 42 is formed on the surface of the transparent insulating film 28 on which the lower electrodes 29 are formed. The transparent insulating film 42 may be made of the same material as the transparent interlayer insulating film 32. In the transparent insulating film 42, there are formed through holes 43 located at which photoelectric conversion layers 41 are to be formed. The presence of the through holes 43 makes it possible to adjust the light-receiving areas of the photoelectric conversion layers 41. It is noted that an optimum light receiving area of the photoelectric conversion layer 41 contributes to an improvement of the modulation transfer function (MTF) in a main scanning direction along which the photoelectric conversion layers 41 are aligned, and a sub-scanning direction perpendicular to the main scanning direction. Additionally, the presence of the optimum light receiving area makes it possible to improve a flatness in a waveform of a white signal.

Figure 11:
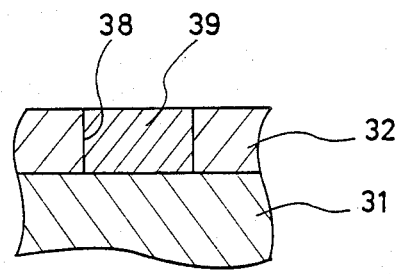
FIG. 11 is an enlarged elevational cross sectional view showing a barrier metallic film which may be formed into a through hole formed in a transparent interlayer insulating film.

In the above embodiments, the upper extension electrodes 33 are kept in direct contact with the corresponding transparent conductive films 31 through the through holes 38. In this case, the transparent conductive films 31 may be damaged during the step of etching by the photolithography technique. In order to eliminate this probability, as shown in FIG. 11, it is preferable to deposit a barrier metal 39 on the exposed surface portion of the transparent conductive film 31. The conductive film 39 may be made of chromium, molybdenum, tungsten or the like.

A description is given of an experiment which was conducted by the inventors. In the experiment, an image sensor having the layer structure of FIGS.5 through 7 was fabricated as follows. The transparent insulating substrate 26 was PYREX #7740 manufactured by Corning Glass. The opaque transparent metallic films 27a-27e having a thickness of 1000 Å, were formed by depositing a chromium film vapor evaporation and then patterning the deposited chromium film by etching in which an etching liquid containing cesium as a major component, was used. The transparent insulating film 28 was formed by depositing a SiON film by PCVD so as to have a thickness of 2 μm. The lower electrodes 29 were formed by depositing a chromium film by chromium vapor evaporation so as to have a thickness of 1000 Å, and patterning the deposited chromium film by etching in which an etching liquid containing cesium as a major component was used. The photoelectric conversion layers 30 were formed by depositing non-doped a-Si on the lower electrodes 29 so as to have a thickness of 1.5 μm, and then depositing a-Si into which boron is doped with a concentration of 1000 ppm on the non-doped a-Si film. The deposition of non-doped a-Si and B-doped a-Si was carried out by PCVD. The non-doped a-Si and B-doped a-Si films were patterned by dry etching where CF$_4$ gas was used. The transparent conductive films 31 were formed by depositing ITO on the entire surface by radio frequency (RF) sputtering in which an In-Sn-O compound target was used, and then patterning the deposited ITO film by etching where an etching liquid mainly containing hydrochloric acid was used. The transparent conductive films 31 were 800 Å in thickness. The transparent interlayer insulating film 32 was formed by depositing a SiON film by PCVD so as to have a thickness of 4000 Å. Then the through holes 38 were formed in the transparent interlayer insulating film 32 by etching in which an etching liquid which mainly contains hydrofluoric acid was used. The upper electrodes 33 were formed by depositing chromium on the transparent interlayer insulating film 32 so as to have a thickness of 500 Å and then depositing aluminum on the deposited chromium film so as to have a thickness of 1 μm, and then patterning the deposited films by etching. The deposition of the Cr film and Al film was carried out by vapor vapor evaporation. The Cr film was patterned by etching in which an etching liquid containing cesium as a major component was used. The Al film was patterned by etching in which an etching liquid mainly containing nitric acid was used. The passivation film 34 was made of SiON and was formed by PCVD so as to have a thickness of 1.5 μm. The transparent wear-resistant film 36 was glass of a thickness of 70 μm on which a Si3N4 film of a thickness of 1.0 μm is coated by PCVD. Epoxy resin was used as the adhesive layer 335. In the etching processes carried out in the above-mentioned fabrication process, resist patterns were formed by the photolithography technique.

In the image sensor thus fabricated, a pitch between adjacent photoelectric conversion layers 30 was 125 μm. The opaque metallic films 27a-27e were 35 μm in width measured in the main scanning direction. The lower electrodes 29 were 100 μm in width in the main scanning direction. The upper electrodes 33 were 90 μm in width in the main scanning direction. An effective area of an a-Si portion of each photoelectric conversion layer 30 was 90 μm in length in the main scanning direction, and was 100 μm in the sub-scanning direction. The number of the photoelectric conversion layers 30 was 1728 which corresponds to A4 size document.

Figure 12:
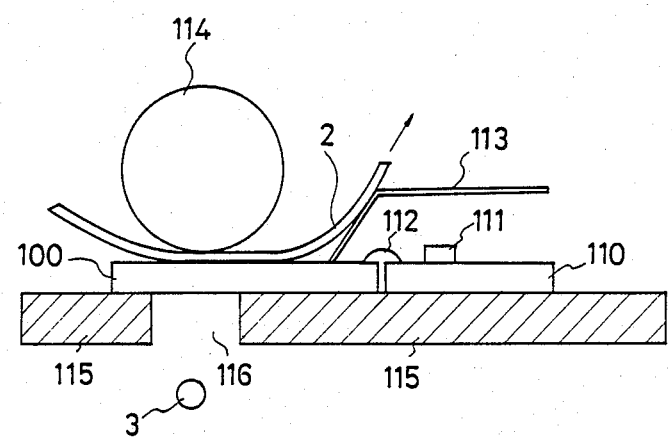
FIG.12 is a side view showing an experiment system.

As shown in FIG. 12, the image sensor 100 thus fabricated was electrically connected to a printed circuit board 100 by bonding wires 112. The image sensor 110 and the printed circuit board 110 were mounted on a base 115, in which there is formed a window 116 through which light emitted from the fluorescence lamp 3 passes. A portion of the image sensor 100 and the printed circuit board 110 were protected by an integrated circuit cover (IC cover) 113. A plurality of IC chips 111 are arranged on the printed circuit board 115. The document 2 was driven by a roller 114 and was made to slide on the image sensor 100 in a direction of an arrow.

Figure 13:
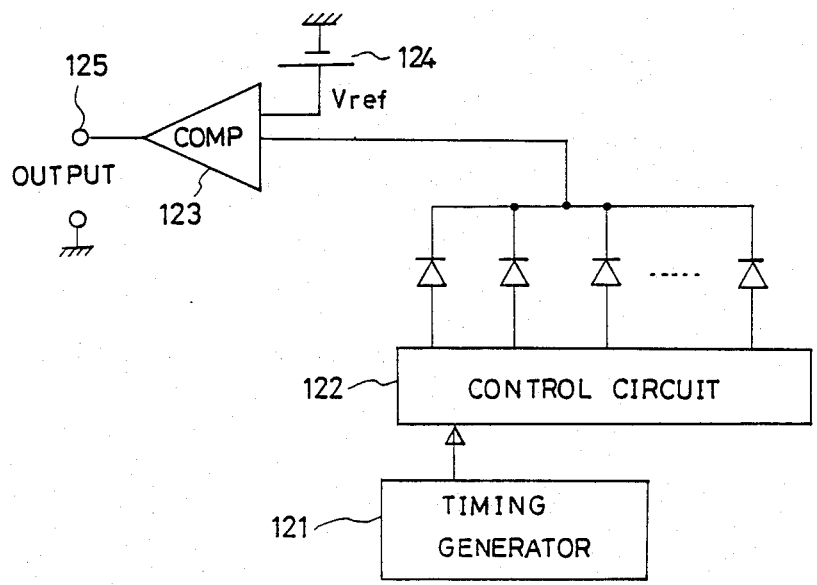
FIG. 13 is a circuit diagram of a circuit used in the experiment.

The printed circuit board 110 has a circuit shown in FIG. 13. The printed circuit board 110 has a timing generator 121, a control circuit 122, a comparator 123, a reference power source 124 and an output terminal 125. The timing generator 121 generates a clock signal and a timing signal. The control circuit 122 includes analog switches and shift registers which drive the analog switches. The analog switches and shift registers are controlled by the clock and timing signals. Diode symbols denote the photoelectric conversion layers or elements 30. Cathodes of the photoelectric conversion elements are mutually connected, and are further connected to an input terminal of the comparator 123. A reference voltage Vref is supplied to the other input terminal of the comparator 123. An output signal of the comparator 123 can be extracted through the output terminal 125.

The following two different documents 2 were used in the experiment. One document (first document) had a black concentration equal to 2, and the other document (second document) had a white concentration equal to 0.1. An average output obtained when the first document was scanned, was assumed as a noise signal (N), an average output obtained when the second document was scanned, was assumed as an effective signal (S). Then the signal-to-noise ratio was calculated in the following equation:

$$S/N = 20 \log(S/N)$$

The calculated S/N ratio was 20 dB.

Further, another document was used in which a black stripe of 125 μm and a white stripe of 125 μm are alternately arranged within a width of 1 mm. Assuming that an output signal of one photoelectric conversion element which reads one black stripe is denoted by "A", and an output signal of the neighboring photoelectric conversion element which reads the neighboring white stripe is denoted by "B", the MTF value was calculated by using the following equation:

$$MTF = [(A-B)/(A+B)] \times 100 \, (\%)$$

The calculated MTF value was 60%.

A ratio of a defective photoelectric conversion element to all the photoelectric conversion elements was 0-1 to 1728.

Figure 1:
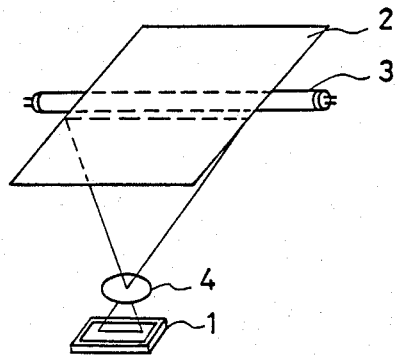
FIG. 1 is a perspective view of an optical reader having a conventional image sensor.
Figure 2:
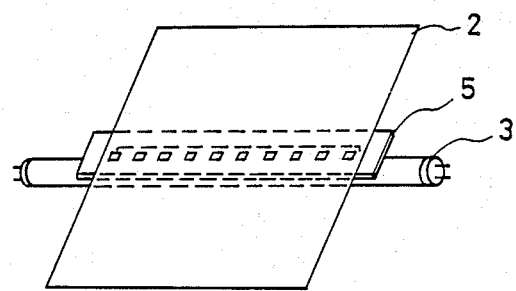
FIG. 2 is a perspective view of an optical reader having another conventional image sensor.
Figure 3:
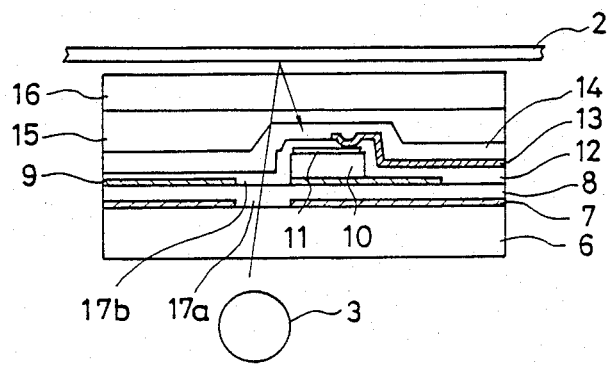
FIG. 3 is an elevational cross sectional view of the image sensor shown in FIG. 2.
Figure 4:
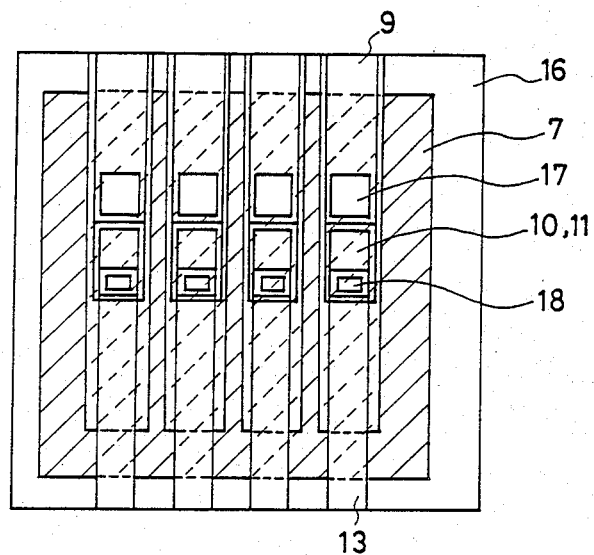
FIG. 4 is an enlarged plan view of the image sensor shown in FIG.3.

In the experiment, a conventional image sensor having the structure of FIGS. 2 through 4 was used. The S/N ratio was 10 dB, and the MTF was 23%. The ratio of a defective element to all the elements was 10-17 to 1728. Another conventional image sensor was used in which one metallic film 7 was provided for every 27 photoelectric conversion elements. In this case, the S/N ratio was 15 dB, and the MTF was 43%. The ratio of a defective element to all the elements was 5-9 to 1728.

It can be seen that the image sensor provided by the present invention is greatly improved, compared with the conventional image sensors.

In the aforementioned embodiments, a peripheral circuit such as a driving circuit and a switching circuit, is not formed on the transparent insulating substrate 26. However, it is possible to form such a circuit on the transparent insulating substrate 26 together with photoelectric conversion elements 30. In this case, thin-film transistors are used for constructing such a circuit. The thin-film transistor may comprise a polysilicon film, which may be formed by thermal decomposition CVD. An image sensor which has the structure shown in FIGS. 5 through 8 and the peripheral circuit had the following characteristics. The S/N ratio was 18 dB, and the MTF was 52%. The ratio of a defective element to all the elements was 0-3 to 1728.

The present invention is not limited to the aforementioned embodiments, and variations and modifications may be made without departing from the scope of the present invention.

What is claimed is:
1. A contact type image sensor comprising:
    a transparent insulating substrate;
    a plurality of opaque metallic films formed on top of the transparent insulating substrate;
    a transparent insulating film formed so as to cover the plurality of opaque metallic films;
    a plurality of lower electrodes formed on top of the transparent insulating film, each having a light window, each opaque metallic film being located between adjacent lower electrodes so as to prevent light emitted from a light source from being irradiated on a document to be scanned;
    a plurality of photoelectric conversion layers formed on the lower electrodes;
    a plurality of transparent conductive films each formed on top of the corresponding photoelectric conversion layer;
    transparent interlayer insulating film formed so as to cover the plurality of photoelectric conversion layers, the transparent interlayer insulating film having through holes for establishing connections with the transparent conductive films; and
    a plurality of upper extension electrodes each connected to the corresponding transparent conductive film through the through hole, each opaque metallic film being located between adjacent upper extension electrodes so as to prevent the light from being irradiated on the document, wherein only light which is emitted from the light source and then passes through the light window, is irradiated on the document.

2. A contact type image sensor as claimed in claim 1, wherein the photoelectric conversion layer is provided for each of the plurality of lower electrodes.

3. A contact type image sensor as claimed in claim 1, wherein more than one photoelectric conversion layers are provided for each of the plurality of lower electrodes.

4. A contact type image sensor as claimed in claim 1, wherein the plurality of photoelectric conversion layers are aligned in a main scanning direction perpendicular to a sub-scanning direction along which the document is transported, and wherein the lower electrodes and the upper extension electrodes extend in the sub-scanning direction.

5. A contact type image sensor as claimed in claim 1, further comprising a barrier metallic film is formed into each of the through holes formed in the interlayer insulating film.

6. A contact type image sensor as claimed in claim 1, wherein the upper extension electrodes partially overlap with the corresponding lower electrodes through the transparent interlayer insulating film, so that capacitance is formed between the upper extension electrodes and the lower electrodes.

7. A contact type image sensor as claimed in claim 1, wherein the opaque metallic films and the lower electrodes partially overlap with each other between which the transparent insulating film is interposed.

8. A contact type image sensor as claimed in claim 7, wherein an overlapping area where the opaque metallic films and the lower electrodes partially overlap with each other, is 5-10 μm.

9. A contact type image sensor as claimed in claim 1, further comprising a passivation film is formed on the transparent interlayer insulating film, and a transparent wear-resistant layer formed on the passivation film.

10. A contact type image sensor comprising:

a transparent insulating substrate;

a plurality of opaque metallic films formed on top of the transparent insulating substrate;

a transparent insulating film formed so as to cover the plurality of opaque metallic films;

a plurality of lower electrodes formed on top of the transparent insulating film, each having a light window, each opaque metallic film being located between adjacent lower electrodes so as to prevent light emitted from a light source from being irradiated on a document to be scanned;

an insulating film formed on the lower electrodes and the surface of the transparent insulating film, the insulating film having through holes through which surfaces of the lower electrodes are partially exposed;

a plurality of photoelectric conversion layers formed on the lower electrodes and the insulating film;

a plurality of transparent conductive films each formed top of the corresponding photoelectric conversion layers;

transparent interlayer insulating film formed so as to cover the plurality of photoelectric conversion layers, the transparent interlayer insulating film having through holes for establishing connections with the transparent conductive films; and a plurality of upper extension electrodes each connected to the corresponding transparent conductive film through the through hole, each opaque metallic film being located between adjacent upper extension electrodes so as to prevent the light from being irradiated on the document, wherein only light which is emitted from the light source and then passes through the light window, is irradiated on the document.

11. A contact type image sensor as claimed in claim 10, wherein the photoelectric conversion layer is provided for each of the plurality of lower electrodes.

12. A contact type image sensor as claimed in claim 10, wherein more than one photoelectric conversion layers are provided for each of the plurality of lower electrodes.

* * * * *